United States Patent
Sakai

(10) Patent No.: US 9,911,695 B2
(45) Date of Patent: Mar. 6, 2018

(54) WIRING BOARD INCLUDING MULTIPLE WIRING LAYERS THAT ARE DIFFERENT IN SURFACE ROUGHNESS

(71) Applicant: SHINKO ELECTRIC INDUSTRIES CO., LTD., Nagano (JP)

(72) Inventor: Toyoaki Sakai, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/244,197

(22) Filed: Aug. 23, 2016

(65) Prior Publication Data

US 2017/0098600 A1 Apr. 6, 2017

(30) Foreign Application Priority Data

Oct. 2, 2015 (JP) .................................. 2015-197091

(51) Int. Cl.
- H01L 23/522 (2006.01)
- H01L 23/528 (2006.01)
- H01L 23/532 (2006.01)
- H01L 23/498 (2006.01)
- H01L 21/48 (2006.01)
- H01L 25/10 (2006.01)

(52) U.S. Cl.
CPC ........ H01L 23/528 (2013.01); H01L 21/4846 (2013.01); H01L 23/49822 (2013.01); H01L 23/5226 (2013.01); H01L 23/53228 (2013.01); H01L 25/105 (2013.01)

(58) Field of Classification Search
None
See application file for complete search history.

(56) References Cited

U.S. PATENT DOCUMENTS

| 9,247,644 B2 | 1/2016 | Kaneko et al. | |
| 2010/0065322 A1* | 3/2010 | Ogawa | H01L 21/563 174/262 |
| 2015/0008020 A1* | 1/2015 | Kaneko | H05K 3/465 174/257 |

FOREIGN PATENT DOCUMENTS

JP 2015-018976 1/2015

* cited by examiner

*Primary Examiner* — Daniel Whalen
(74) *Attorney, Agent, or Firm* — IPUSA, PLLC

(57) ABSTRACT

A wiring board includes an insulating layer, a first wiring layer, and a second wiring layer. The first wiring layer is formed in a first surface of the insulating layer, and includes a pad on which a semiconductor chip is to be mounted and a wiring pattern. The second wiring layer is formed on a second surface of the insulating layer opposite to the first surface. The roughness of a surface of the first wiring layer exposed at the first surface of the insulating layer is smaller than the roughness of a surface of the second wiring layer exposed on the second surface of the insulating layer.

18 Claims, 9 Drawing Sheets

WIRING BOARD INCLUDING MULTIPLE WIRING LAYERS THAT ARE DIFFERENT IN SURFACE ROUGHNESS

CROSS-REFERENCE TO RELATED APPLICATION

This application is based upon and claims the benefit of priority of the prior Japanese Patent Application No. 2015-197091, filed on Oct. 2, 2015, the entire contents of which are incorporated herein by reference.

FIELD

A certain aspect of the embodiments discussed herein is related to wiring boards.

BACKGROUND

A so-called build-up wiring board including wiring layers stacked alternately with insulating layers to be interconnected by via holes piercing through the insulating layers is known.

To manufacture such a wiring board, for example, wiring layers and insulating layers are stacked on a flat surface of a support, and thereafter, the support is removed. As a result, a surface of a wiring layer and a surface of an insulating layer that have been in contact with the support are exposed at the same flat surface. Next, the surface of the wiring layer that has been in contact with the support is etched to be roughened. Thereafter, a solder resist layer is formed to cover part of the roughened surface of the wiring layer to selectively expose the wiring layer. The surface of the wiring layer is roughened to increase adhesion between the wiring layer and the solder resist layer. (See, for example, Japanese Laid-open Patent Publication No. 2015-018976.)

SUMMARY

According to an aspect of the present invention, a wiring board includes an insulating layer, a first wiring layer, and a second wiring layer. The first wiring layer is formed in a first surface of the insulating layer, and includes a pad on which a semiconductor chip is to be mounted and a wiring pattern. The second wiring layer is formed on a second surface of the insulating layer opposite to the first surface. The roughness of a surface of the first wiring layer exposed at the first surface of the insulating layer is smaller than the roughness of a surface of the second wiring layer exposed on the second surface of the insulating layer.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
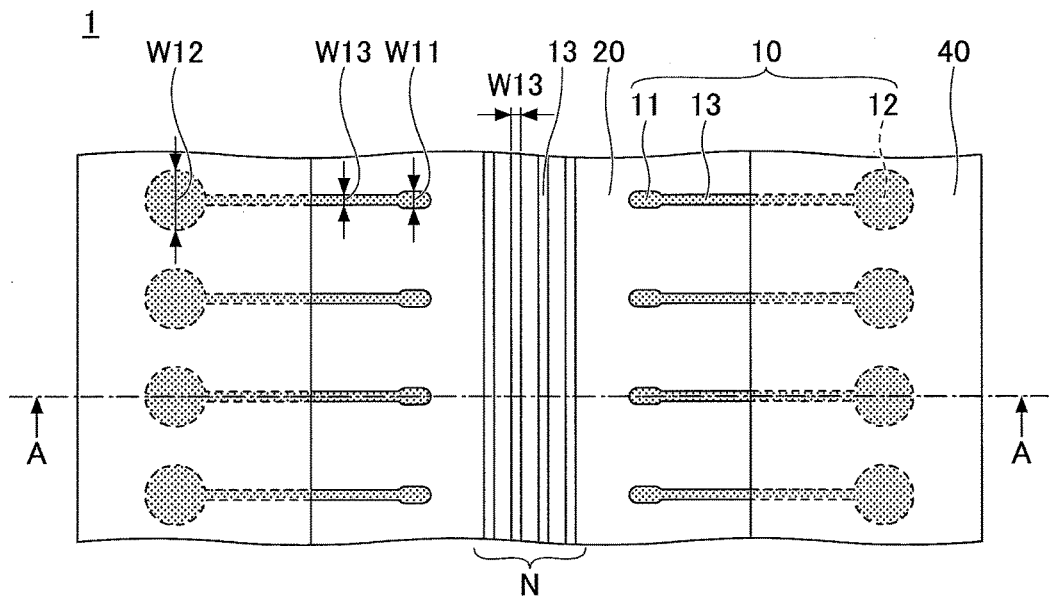
FIGS. 1A and 1B are diagrams depicting a wiring board according to a first embodiment.

According to the above-described technique of manufacturing a build-up wiring board, a surface of a wiring layer that has been in contact with a support is etched to be roughened. Etching the surface of the wiring layer, however, reduces the thickness of the wiring layer, so that the thickness of the wiring layer may differ from its designed value. This may become a problem and cause breakage of the wiring layer particularly when the wiring layer is formed to be thin for miniaturization.

According to an aspect of the present invention, a wiring board that can ensure a wiring layer of a desired thickness is provided.

Embodiments of the present invention are described below with reference to the accompanying drawings. In the drawings, the same elements are referred to using the same reference numeral, and a repetitive description thereof may be omitted.

First Embodiment

Figure 1B:
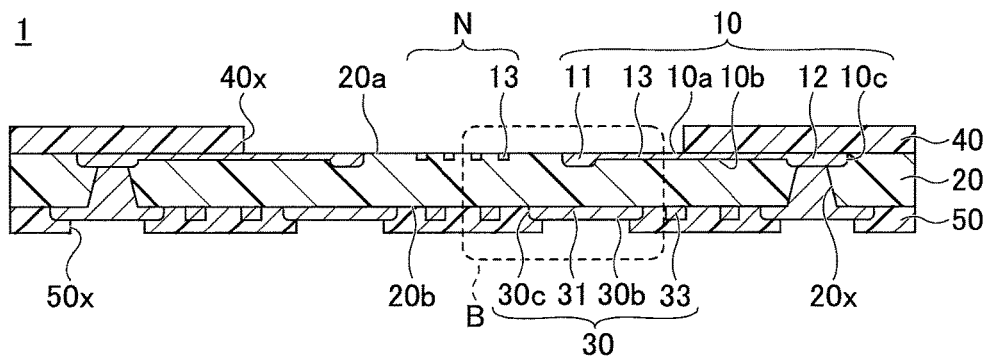

First, a structure of a wiring board according to a first embodiment is described. FIG. 1A is a plan view of part of a wiring board according to the first embodiment. FIG. 1B is a cross-sectional view of the wiring board, taken along a line A-A in FIG. 1A.

Referring to FIG. 1, a wiring board 1 is a coreless build-up wiring board that includes a wiring layer 10, an insulating layer 20, a wiring layer 30, and solder resist layers 40 and 50. In FIG. 1A, the wiring layer 10 is indicated by dotted patterns for the sake of convenience.

According to this embodiment, for convenience of description, the solder resist 40 side of the wiring board 1 will be referred to as "upper side" or "first side," and the solder resist 50 side of the wiring board 1 will be referred to as "lower side" or "second side." Furthermore, with respect to each part or element of the wiring board 1, a surface on the solder resist 40 side will be referred to as "upper surface" or "first surface," and a surface on the solder resist 50 side will be referred to as "lower surface" or "second surface." The wiring board 1, however, may be used in an inverted position or oriented at any angle. Furthermore, a plan view refers to a view of an object taken in a direction normal to the first surface of the solder resist 40, and a planar shape refers to the shape of an object viewed in a direction normal to the first surface of the solder resist 40.

According to the wiring board 1, a surface at which the wiring layer 10 is formed is a semiconductor chip mounting surface on which a semiconductor chip is to be mounted, and a surface at which the wiring layer 30 is formed is an external connection surface opposite to the semiconductor chip mounting surface.

The wiring layer 10 is the outermost wiring layer of the wiring board 1 on its semiconductor chip mounting surface side, and is buried in an upper surface (first surface) 20a of the insulating layer 20. An upper surface (first surface) 10a of the wiring layer 10 is exposed at the upper surface 20a of the insulating layer 20. A lower surface (second surface) 10b and a side surface 10c of the wiring layer 10 are covered with the insulating layer 20. The upper surface 10a of the wiring layer 10 may be flush with, for example, the upper surface 20a of the insulating layer 20. The wiring layer 10 is formed of a single metal layer. Suitable materials for the wiring layer 10 include, for example, copper (Cu). The wiring layer 10 includes external connection pads 11 ("pads 11") to be connected to a semiconductor chip, via receiving pads 12 ("pads 12") connected to ends of vias of the wiring layer 30, and wiring patterns 13. That is, the wiring layer 10 includes the pads 11 serving as semiconductor chip mounting pads onto which a semiconductor chip is to be mounted, and the wiring patterns 13 extending from the pads 11. The pads 11 may be connected to the pads 12 through the wiring patterns 13 extending from the pads 11.

According to this embodiment, the wiring layer 10 includes a narrow part having a small width (a first part) and a wide part having a large width (a second part). The wiring layer 10 is thinner in the narrow part than in the wide part. Whether a part is narrow or wide may be suitably determined in accordance with the specifications of the wiring board 1. Here, by way of example, a part is narrow if the diameter of the part is 15 μm or less, and a part is wide if the diameter of the part is more than 15 μm. Here, the width of a part refers to the diameter of the part when the planar shape of the part is a circle, the minor axis of the part when the planar shape of the part is an ellipse, and the shorter side of the part when the planar shape of the part is elongated.

The pads 11 and 12 are wide parts, and the wiring patterns 13 are narrow parts. A width W11 of the pads 11 may be, for example, approximately 25 μm. The interval of the pads 11 may be, for example, approximately the same as the width W11 of the pads 11. A width W12 of the pads 12 may be, for example, approximately 80 μm. The interval of the pads 12 may be, for example, approximately the same as the width W12 of the pads 12. The thickness of the pads 11 may be, for example, approximately 1 μm to approximately 35 μm. The thickness of the pads 12 may be, for example, approximately 1 μm to approximately 35 μm.

A width W13 of the wiring patterns 13 may be, for example, approximately 10 μm. The interval of the wiring patterns 13 may be, for example, approximately the same as the width W13 of the wiring patterns 13. The thickness of the wiring patterns 13 may be, for example, approximately 1 μm to approximately 30 μm.

The wiring patterns 13 at a center N of the wiring layer 10 in FIGS. 1A and 1B are arranged at a narrow pitch to be formed as a part of a particularly narrow line and space. Here, the line of a line and space represents the width of a wiring pattern, and the space of a line and space represents the interval between adjacent wiring patterns. For example, a line and space of 8 μm and 8 μm indicates that the width of wiring patterns is 8 μm and the interval between adjacent wiring patterns is 8 μm. According to this embodiment, a part of a particularly narrow line and space is a part of a line and space of 8 μm and 8 μm or less. Wiring patterns of a line and space of approximately 1 μm and 1 μm to approximately 3 μm and 3 μm may be formed as a part of a particularly narrow line and space.

The upper surfaces of the pads 11, the upper surfaces of the pads 12, and the upper surfaces of the wiring patterns 13 are in the same plane. That is, while the thickness of the pads 11 and 12 is different from the thickness of the wiring patterns 13, the upper surfaces of the pads 11 and 12 and the wiring patterns 13 exposed in the insulating layer 20 are flush with one another, and the lower surfaces of the pads 11 and 12 and the wiring patterns 13 extending from the pads 11 opposite to their exposed surfaces form steps in the insulating layer 20.

The wiring layer 10 is a typical example of a first wiring layer according to an embodiment of the present invention, and the upper surface 10a of the wiring layer 10 (the upper surfaces of the pads 11 and 12 and the wiring patterns 13) is a typical example of a first exposed surface of the first wiring layer according to an embodiment of the present invention. Furthermore, the wiring patterns 13 are typical examples of a first wiring pattern according to an embodiment of the present invention.

The insulating layer 20 is a layer where the wiring layer 10 and the wiring layer 30 are formed. Suitable materials for the insulating layer 20 include, for example, a thermosetting insulating resin whose principal component is an epoxy resin, an imide resin, a phenolic resin, or a cyanate resin. A thermosetting insulating resin used as the insulating layer 20 may be either a non-photosensitive resin or a photosensitive resin. Furthermore, the insulating layer 20 may contain a reinforcing member formed of a woven or non-woven fabric of glass fibers, aramid fibers or the like. The insulating layer 20 may further contain a filler such as silica ($SiO_2$). The thickness of the insulating layer 20 may be, for example, approximately 10 μm to approximately 50 μm.

The wiring layer 30 is the outermost wiring layer of the wiring board 1 on its external connection surface side, and is formed on a second surface (lower surface) 20b of the insulating layer 20. Suitable materials for the wiring layer 30 include, for example, copper. The wiring layer 30 includes external connection pads 31 ("pads 31") to be connected to another wiring board or the like, and wiring patterns 33. The pads 31 may be connected to the wiring patterns 33. The pads 31 are connected to the pads 12 through vias filling in via holes 20x piercing through the insulating layer 20 to expose the lower surfaces of the pads 12. Each via hole 20x has the shape of a truncated cone, and has an upper-side opening and a lower-side opening that are open at the upper surface 20a and the lower surface 20b, respectively, of the insulating layer 20. The lower-side opening is greater in diameter than the upper-side opening. Each pad 31 is monolithically formed with one of the vias in the via holes 20x.

The width of the pads 31 may be, for example, approximately 150 μm. The thickness of the pads 31 may be, for example, approximately 2 μm to approximately 30 μm. The width of the wiring patterns 33 may be, for example, approximately 10 μm. The thickness of the wiring patterns 33 may be, for example, approximately 2 μm to approximately 30 μm. The wiring layer 30 may include via receiving pads that are connected to the wiring patterns 33 and connected to the pads 12 through vias. The wiring patterns 33 may have a line and space of, for example, approximately 2 μm and 2 μm to approximately 100 μm and 100 μm.

The wiring layer 30 is a typical example of a second wiring layer according to an embodiment of the present invention. A lower surface 30b and a side surface 30c of the wiring layer 30 (the lower surfaces and side surfaces of the pads 31 and the lower surfaces and side surfaces of the wiring patterns 33) are typical examples of a second exposed surface of the second wiring layer according to an embodiment of the present invention. The wiring patterns 33 are typical examples of a second wiring pattern according to an embodiment of the present invention.

The solder resist layer 40 is formed on the upper surface 20a of the insulating layer 20 to cover the wiring layer 10. An opening 40x is formed in the solder resist layer 40 to expose part of the wiring layer 10 (such as the pads 11 and part of the wiring patterns 13) at the bottom of the opening 40x. The solder resist layer 50 is formed on the lower surface 20b of the insulating layer 20 to cover the wiring layer 30. Openings 50x are formed in the solder resist layer 50 to expose the lower surfaces of the pads 31 of the wiring layer 30 at the bottom of the openings 50x. Suitable materials for the solder resist layers 40 and 50 include, for example, a photosensitive epoxy insulating resin, a photosensitive acrylic insulating resin, etc. The thickness of the solder resist layer 40 may be, for example, approximately 5 μm to approximately 40 μm. The thickness of the solder resist layer 50 may be, for example, approximately 5 μm to approximately 40 μm.

A metal layer may be formed on the upper surface 10a of the wiring layer 10 exposed in the opening 40x, and a metal layer may be formed on the lower surface 30b of the wiring layer 30 exposed in the openings 50x, as desired. Suitable examples of metal layers include a gold (Au) layer, a Ni/Au layer (a laminated metal layer of a nickel [Ni] layer and a Au layer that are stacked in this order), and a Ni/Pd/Au layer (a laminated metal layer of a Ni layer, a palladium [Pd] layer, and a Au layer that are stacked in this order). Instead of forming a metal layer, an anti-oxidation treatment such as an organic solderability preservative (OSP) process may be performed. A surface treatment layer formed by the OSP process is an organic coating formed of, for example, an azole compound or an imidazole compound.

Figure 2:
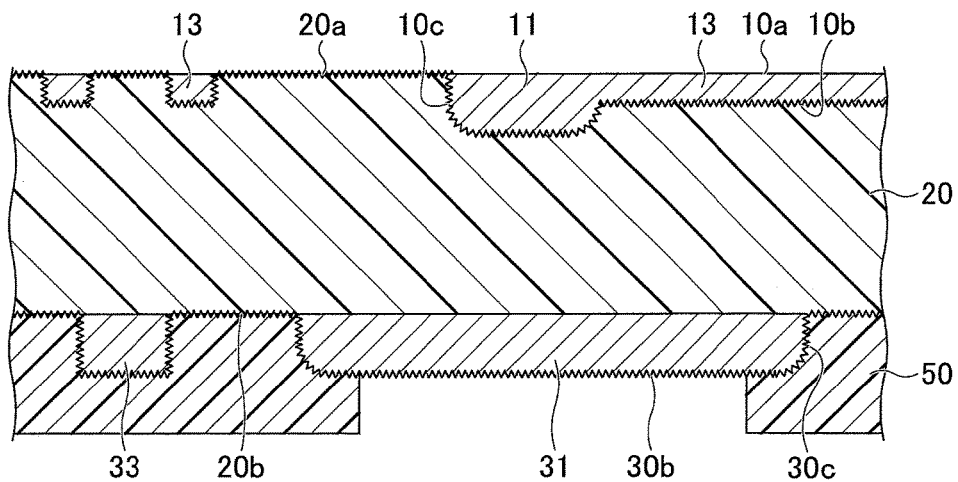
FIG. 2 is an enlarged view of part of the cross-sectional view of FIG. 1B indicated by B.

FIG. 2 is an enlarged view of part of the cross-sectional view of FIG. 1B indicated by B. The roughness of parts of the wiring board 1 is described with reference to FIG. 2. The upper surfaces of the pads 11 and the upper surfaces of the wiring patterns 13 are flat surfaces, and have a roughness Ra of approximately 30 nm to approximately 300 nm. In contrast, the roughness Ra of the side surfaces and lower surfaces of the pads 11 and the side surfaces and lower surfaces of the wiring patterns 13 is greater than the roughness Ra of the upper surfaces of the pads 11 and the wiring patterns 13, and is approximately 50 nm to approximately 500 nm. The upper surfaces, side surfaces, and lower surfaces of the pads 12, which are not depicted in FIG. 2, have the same roughness Ra as the upper surfaces, side surfaces, and lower surfaces, respectively, of the pads 11 and the wiring patterns 13.

The roughness Ra of the side surfaces and lower surfaces of the pads 31 and the side surfaces and lower surfaces of the wiring patterns 33 is greater than the roughness Ra of the upper surfaces of the pads 11 and the wiring patterns 13, and is approximately 50 nm to approximately 500 nm. The magnitude relationship between the roughness Ra of the side surfaces and lower surfaces of the pads 11 and the wiring patterns 13 and the roughness Ra of the side surfaces and lower surfaces of the pads 31 and the wiring patterns 33 may be determined as desired.

The upper surfaces of the pads 11, the pads 12, and the wiring patterns 13 may be substantially flush with the upper surface 20a of the insulating layer 20. That is, there is no substantial difference in level between the upper surface 10a of the wiring layer 10 and the upper surface 20a of the insulating layer 20 at the semiconductor chip mounting surface of the wiring board 1. This is because the upper surface 10a of the wiring layer 10 is not etched as illustrated in the below-described manufacturing processes. Therefore, it is possible to prevent reduction in the thickness of the wiring layer 10, and accordingly, to provide the wiring layer 10 buried in the insulating layer 20 with a desired thickness.

The upper surface 20a and the lower surface 20b of the insulating layer 20 also are roughened. The upper surface 20a of the insulating layer 20 has a roughness Ra of approximately 50 nm to approximately 500 nm. The lower surface 20b of the insulating layer 20 has a roughness Ra of approximately 50 nm to approximately 500 nm.

Figure 3A:
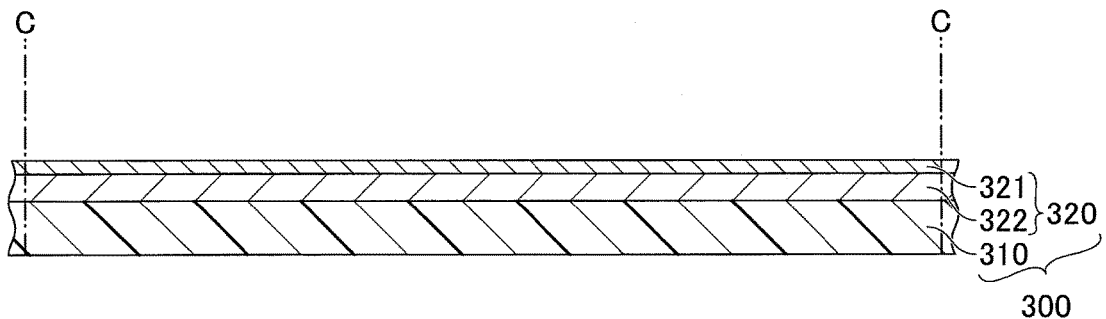
FIGS. 3A through 3O are diagrams depicting a process of manufacturing a wiring board according to the first embodiment.

Next, a method of manufacturing a wiring board according to the first embodiment is described. FIGS. 3A through 3O are diagrams depicting a process of manufacturing a wiring board according to the first embodiment. According to this embodiment, by way of example, a structure to become multiple wiring boards is formed on a support, and after removal of the support, the structure is divided into individual wiring boards. Alternatively, however, individual wiring boards may be formed on a support, and thereafter, the support may be removed.

First, in the process depicted in FIG. 3A, a support 300 having a flat top surface is prepared. A prepreg 310 on which metal foil with a carrier ("carrier-supported metal foil") 320 is stacked may be used as the support 300. The thickness of the support 300 may be, for example, approximately 18 μm to approximately 100 μm.

The prepreg 310 is a woven or non-woven fabric of glass fibers, aramid fibers or the like (not depicted) impregnated with an insulating resin such as an epoxy resin. The carrier-supported metal foil 320 includes thick foil (carrier foil) 322 formed of copper and having a thickness of approximately 10 μm to approximately 50 μm, and thin foil 321 formed of copper and having a thickness of approximately 1.5 μm to approximately 5 μm. The thin foil 321 separably adheres to the thick foil 322 through a delamination layer (not depicted). The thick foil 322 is provided as a support for facilitating handling of the thin foil 321. The bottom surface of the thick foil 322 is bonded to the top surface of the prepreg 310.

Figure 3B:
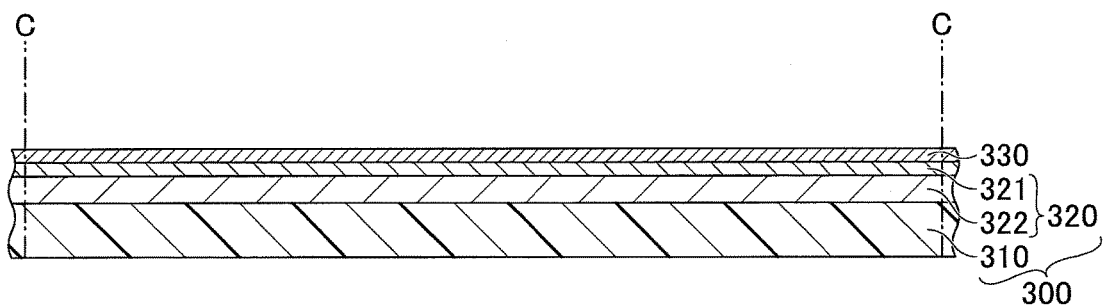

Next, in the process depicted in FIG. 3B, for example, electroplating is performed, using the carrier-supported metal foil 320 as a plating power feed layer, to form a barrier layer 330 on the top surface of the thin foil 321 of the support 300. The barrier layer 330 serves as an etch stop layer when the thin foil 321 is removed by etching in a subsequent process. Suitable materials for the barrier layer 330 include, for example, a metal not removed with an etchant for the thin foil 321 formed of copper, such as nickel. The thickness of the barrier layer 330 may be, for example, approximately a few microns (μm).

Figure 3C:
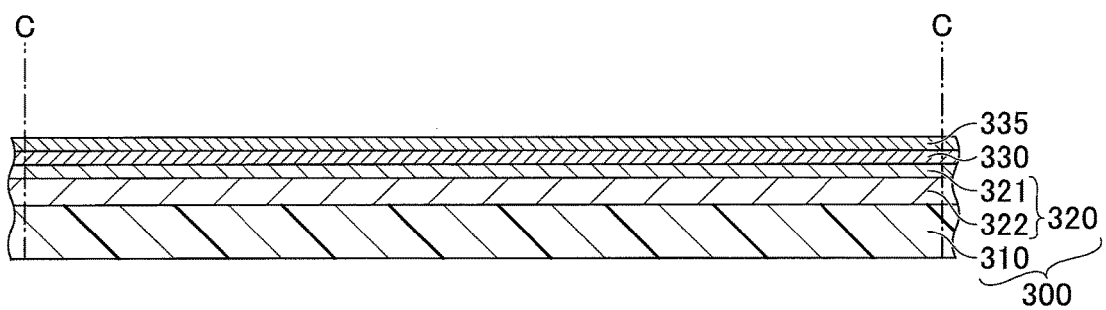

Next, in the process depicted in FIG. 3C, for example, electroless plating is performed to form a protection layer 335 on the top surface of the barrier layer 330. The protection layer 335 serves to protect the first surface 10a of the wiring layer 10 from being etched in a subsequent process. Suitable materials for the protection layer 335 may be the same as those for the wiring layer 30 (such as copper). The thickness of the protection layer 335 may be, for example, approximately 1 μm. The protection layer 335 may alternatively be formed by electroplating.

Figure 3D:
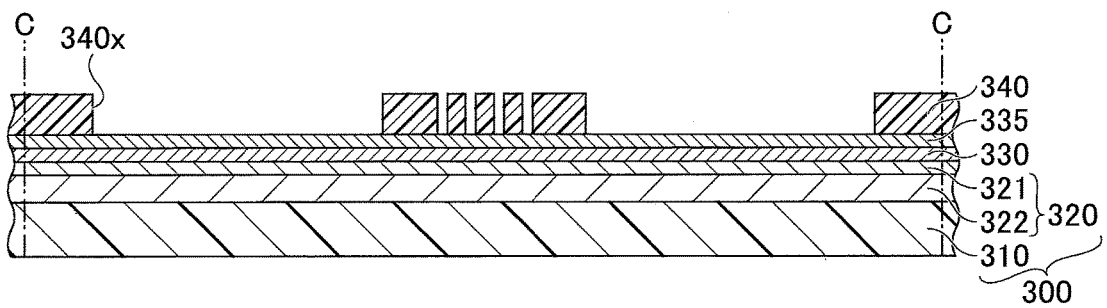

Next, in the process depicted in FIG. 3D, a resist layer 340 is formed on the top surface of the protection layer 335. The resist layer 340 includes openings 340x in which the wiring layer 10 is to be formed. Specifically, for example, the top surface of the protection layer 335 is laminated with a dry film resist formed of a photosensitive resin as the resist layer 340. The dry film resist is exposed to light and developed to be patterned to form the openings 340x that expose the top surface of the protection layer 335 where the wiring layer 10 is to be formed.

Figure 3E:
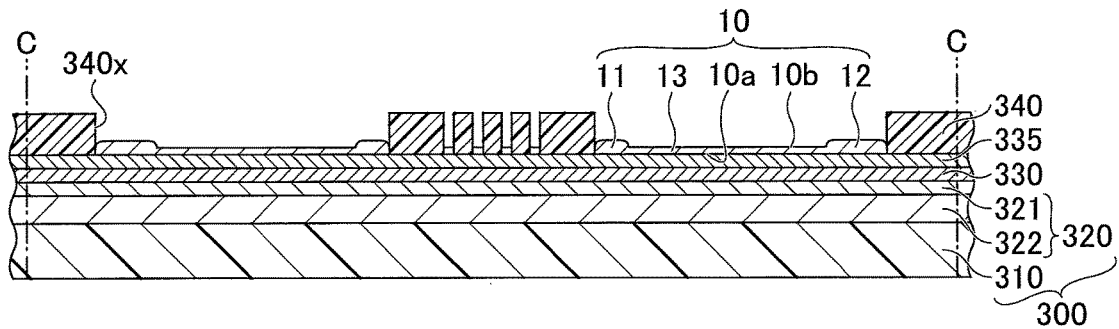

Next, in the process depicted in FIG. 3E, electroplating is performed, using the carrier-supported metal foil 320, the barrier layer 330, and the protection layer 335 as plating power feed layers, to form the wiring layer 10 on the top surface of the protection layer 335 exposed in the openings 340x. The first surface 10a of the wiring layer 10 contacts the top surface of the protection layer 335, and the second surface 10b of the wiring layer 10 is exposed in the openings 340x.

For example, a bath of an electrolytic copper plating solution prepared from copper sulfate and sulfuric acid of a predetermined concentration ratio is used to deposit copper plating on the protection layer 335, so that the pads 11 and 12, which are wide parts, may be formed to be thick, and the wiring patterns 13, which are narrow parts, may be formed to be thin. At this point, the concentration ratio of copper sulfate and sulfuric acid (copper sulfate/sulfuric acid) is preferably set within the range of 1 to 5 to particularly reduce the thickness of the narrow part of the wiring patterns 13. Examples of the numerical values of width and thickness of the pads 11, the pads 12, and the wiring patterns 13 are as described above with reference to FIGS. 1A and 1B.

Figure 3F:
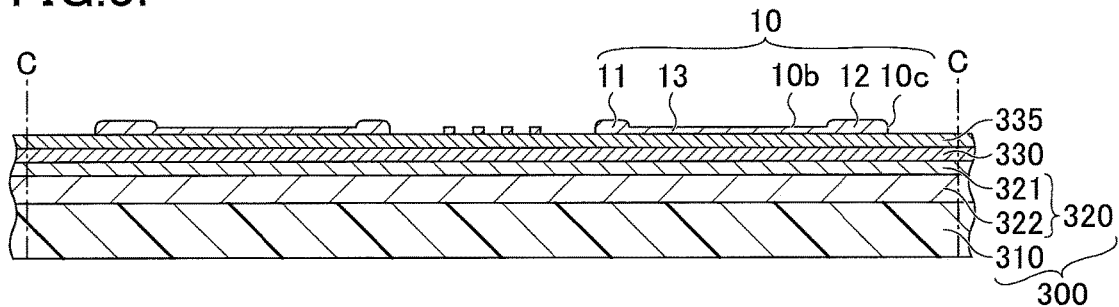

Next, in the process depicted in FIG. 3F, the resist layer 340 depicted in FIG. 3E is separated. For example, a liquid separating agent (remover) containing sodium hydroxide may be used to separate the resist layer 340. At this point, if the narrow wiring patterns 13 were thick, there would be resist patterns of a narrow pitch and a high aspect ratio sandwiched between the wiring patterns 13 of a narrow pitch and a high aspect ratio, so that poor removal of resist patterns would be likely to occur.

In contrast, according to this embodiment, plating conditions are adjusted to reduce the thickness of the wiring patterns 13 in the process depicted in FIG. 3E. Therefore, in each of the resist patterns of a narrow pitch and a high aspect ratio sandwiched between the wiring patterns 13 of a narrow pitch, it is possible to reduce the area of contact of the side surfaces of the resist pattern with the adjacent wiring patterns 13.

As a result, because the area of contact of the side surfaces of the resist patterns with the wiring patterns 13 is reduced, it is possible to easily remove the resist patterns even when the mechanical distortion of the resist patterns is relatively small. Accordingly, it is possible to prevent occurrence of poor removal of the resist layer 340. This effect is remarkable in part of the wiring layer having a line and space of 8 μm and 8 μm or less, particularly in part of the wiring layer 10 formed as the wiring patterns 13 of a narrow line and space (for example, the center N in FIGS. 1A and 1B).

After removal of the resist layer 340, the second surface 10b and the side surface 10c of the wiring layer 10 are roughened. When the wiring layer 10 is formed of copper, for example, an aqueous solution of hydrogen peroxide and sulfuric acid, an aqueous solution of sodium persulfate, or an aqueous solution of ammonium persulfate may be used to perform roughening. At this point, when the protection layer 335 is formed of copper, the top surface of the protection layer 335 also is roughened at the same time. The second surfaces and side surfaces of the pads 11, the pads 12, and the wiring patterns 13 after roughening may have a roughness Ra of approximately 50 nm to approximately 500 nm. Likewise, the top surface of the protection layer 335 may have a roughness Ra of approximately 50 nm to approximately 500 nm. Performing roughening on the wiring layer 10 makes it possible to increase adhesion between the insulating layer 20 formed in the process depicted in FIG. 3G and the wiring layer 10. Furthermore, performing roughening on the protection layer 335 makes it possible to transfer the irregularities of the roughened surface of the protection layer 335 to the first surface 20a of the insulating layer 20 formed in the process depicted in FIG. 3G.

Figure 3G:
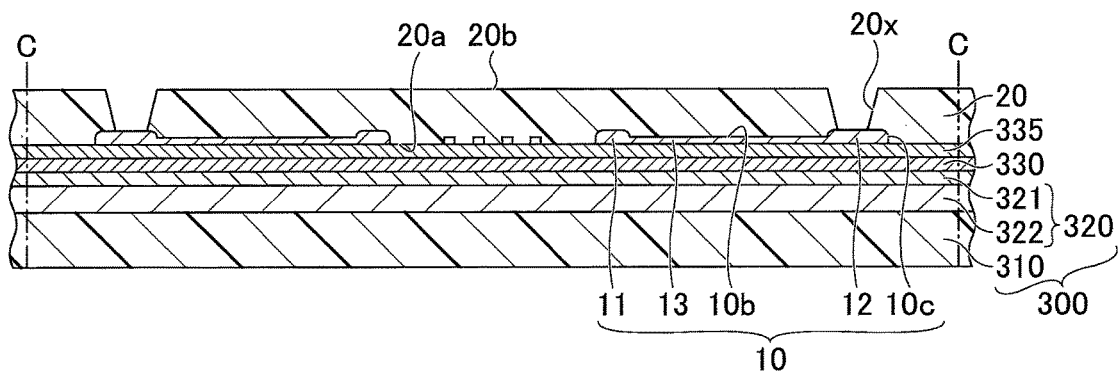

Next, in the process depicted in FIG. 3G, the insulating layer 20 is formed on the top surface of the protection layer 335 to cover the second surface 10b and the side surface 10c of the wiring layer 10, and the via holes 20x are formed to pierce through the insulating layer 20 to expose the second surfaces of the pads 12. Specifically, the top surface of the protection layer 335 is laminated with, for example, a thermosetting epoxy insulating resin in the form of a film formed to cover the wiring layer 10. Alternatively, for example, a thermosetting epoxy insulating resin in the form of liquid or paste is applied on the top surface of the protection layer 335 by a process such as screen printing or spin coating to cover the wiring layer 10. The laminate of insulating resin or the applied insulating resin is heated to a curing temperature or higher while being pressed, to be cured to form the insulating layer 20.

Then, the via holes 20x are formed to pierce through the insulating layer 20 to expose the second surfaces of the pads 12. The via holes 20x may be formed by, for example, laser processing using a $CO_2$ laser. Because the pads 12 exposed to laser light are formed to be thick, it is possible to reduce the possibility of penetration of the laser light through the pads 12.

In the case of forming the via holes 20x by laser processing, it is preferable to perform a desmear process to remove the residual resin of the insulating layer 20 adhering to the second surfaces of the pads 12 exposed at the bottom of the via holes 20x. By performing a desmear process, it is possible to roughen the second surface 20b of the insulating layer 20 as well as to remove the residual resin. The roughness Ra of the second surface 20b of the insulating layer 20 after roughening may be, for example, approximately 50 nm to approximately 500 nm. For example, aqueous solutions of permanganic acid (such as an aqueous solution of potassium permanganate and an aqueous solution of sodium permanganate) may be used for a desmear process.

Figure 3H:
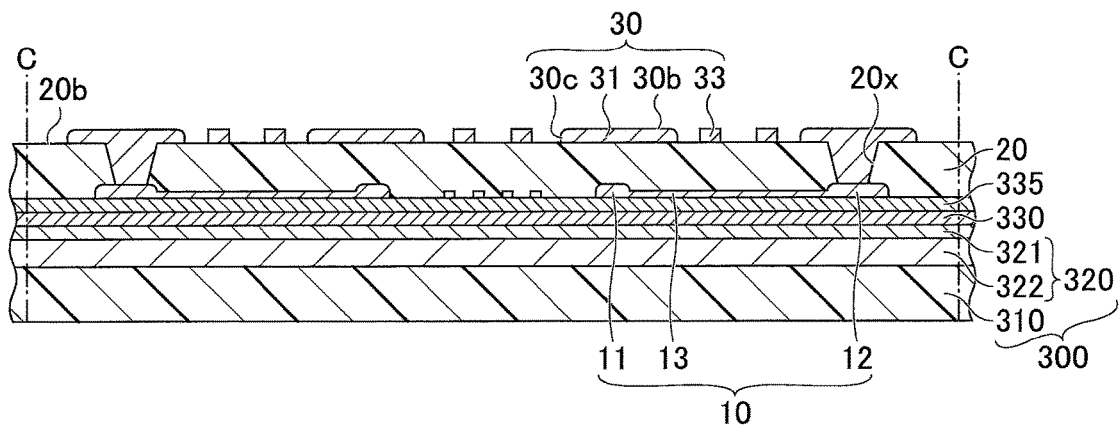

Next, in the process depicted in FIG. 3H, the wiring layer 30 including the pads 31 and the wiring patterns 33 is formed on the insulating layer 20. The pads 31 are connected to the pads 12 through vias filling in the via holes 20x that pierce through the insulating layer 20 to expose the second surfaces of the pads 12. The wiring layer 30 may be formed by, for example, a semi-additive process.

To form the wiring layer 30 using a semi-additive process, first, a seed layer (not depicted) formed of, for example, copper is formed by electroless plating or sputtering. The seed layer is formed on the entire second surfaces of the pads 12 exposed at the bottom of the via holes 20x and on the entire second surface 20b of the insulating layer 20 including the inner wall surfaces of the via holes 20x. Furthermore, a resist layer (not depicted) having openings corresponding to the wiring layer 30 is formed on the seed layer. Then, electroplating is performed, using the seed layer as a power feed layer, to form an electroplating layer (not depicted)

formed of copper in the openings of the resist layer. Next, after removal of the resist layer, etching is performed, using the electroplating layer as a mask, to remove the seed layer not covered with the electroplating layer. As a result, the wiring layer 30 including the seed layer and the electroplating layer stacked on the seed layer is formed.

After formation of the wiring layer 30, the second surface 30b and the side surface 30c of the wiring layer 30 are roughened. For example, an aqueous solution of hydrogen peroxide and sulfuric acid, an aqueous solution of sodium persulfate, or an aqueous solution of ammonium persulfate may be used to perform roughening. The roughness Ra of the second surface 30b and the side surface 30c of the wiring layer 30 after roughening may be, for example, approximately 50 nm to approximately 500 nm. Performing roughening on the wiring layer 30 and the insulating layer 20 makes it possible to increase adhesion between the solder resist layer 50 formed in the process depicted in FIG. 3I and each of the wiring layer 30 and the insulating layer 20.

Figure 3I:
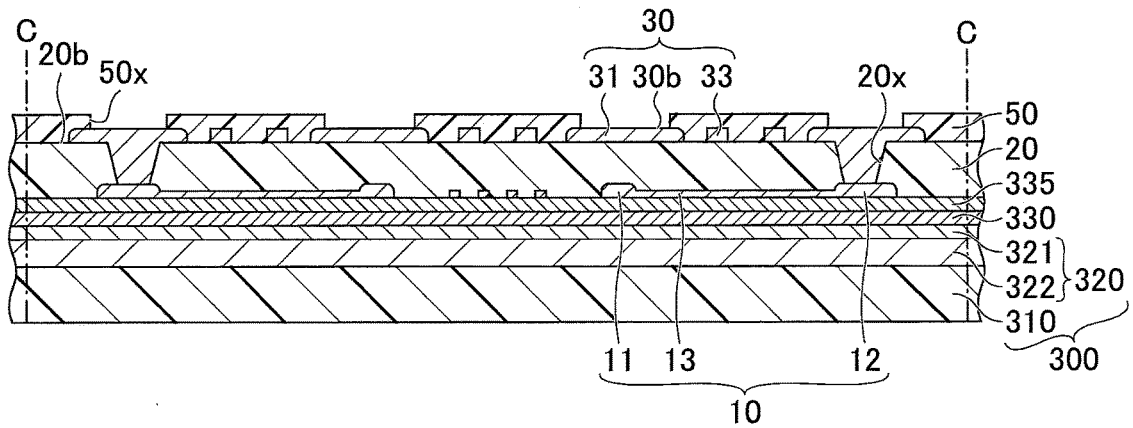

Next, in the process depicted in FIG. 3I, the solder resist layer 50 is formed on the second surface 20b of the insulating layer 20 to cover the wiring layer 30. For example, the solder resist layer 50 may be formed by applying an insulating resin in the form of liquid or paste on the second surface 20b of the insulating layer 20 by a process such as screen printing, roll coating, or spin coating so that the wiring layer 30 is covered with the insulating resin. The solder resist layer 50 may alternatively be formed by laminating the second surface 20b of the insulating layer 20 with an insulating resin in the form of a film so that the wiring layer 30 is covered with the insulating resin. For example, a photosensitive epoxy insulating resin or a photosensitive acrylic insulating resin may be used as an insulating resin.

The applied insulating resin or the laminate of insulating resin is exposed to light and developed to form the openings 50x that expose the wiring layer 30 in the solder resist layer 50 (photolithography). In the case of using a non-photosensitive insulating resin (thermosetting resin) whose principal component is an epoxy resin or a polyimide resin as the material of the solder resist layer 50, the openings 50x may be formed by laser processing or blasting.

A metal layer may be formed on the second surface 30b of the wiring layer 30 exposed at the bottom of the openings 50x by, for example, electroless plating, as desired. Suitable examples of metal layers are as described above. Furthermore, an anti-oxidation treatment such as an OSP process may be performed on the second surface 30b of the wiring layer 30 exposed at the bottom of the openings 50x.

Figure 3J:
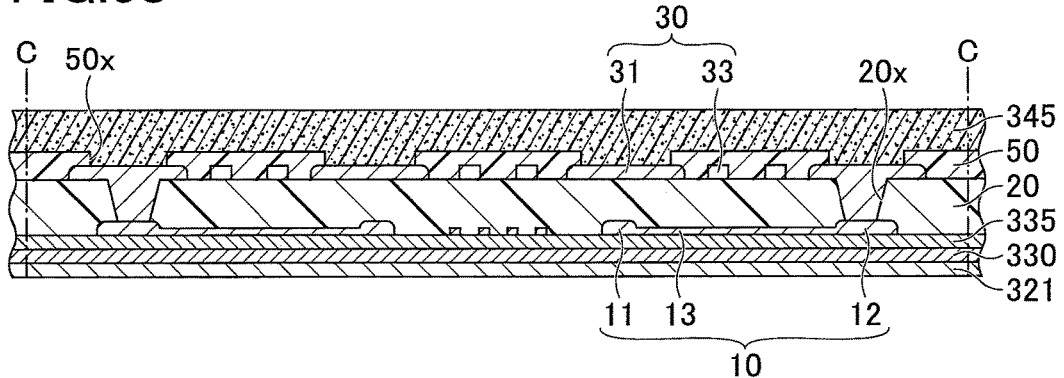

Next, in the process depicted in FIG. 3J, a mask 345 is formed on the solder resist layer 50, using a resin film or the like. The mask 345 fills in the openings 50x. For example, a polyethylene terephthalate film may be used as a resin film. The mask 345 is formed to protect the wiring layer 30 at the time of etching, for example, the thin foil 321.

After formation of the mask 345, part of the support 300 is removed. Specifically, a mechanical force is applied to the support 300 to delaminate the carrier-supported metal foil 320 at the interface of the thin foil 321 and the thick foil 322. As described above, the carrier-supported metal foil 320 has the thick foil 322 adhering to the thin foil 321 through a delamination layer (not depicted). Therefore, the thick foil 322, together with the delamination layer, is easily separated from the thin foil 321.

As a result, the thin foil 321 alone remains on the barrier layer 330, and the other members of the support 300 (the prepreg 310 and the thick foil 322) are removed. In addition to the case where the thick foil 322, together with the delamination layer, is separated from the thin foil 321, it is also possible that a cohesive failure occurs inside the delamination layer to separate the thick foil 322 from the thin foil 321. Furthermore, it is also possible that the thick foil 322 is separated from the delamination layer to be separated from the thin layer 321.

Figure 3K:
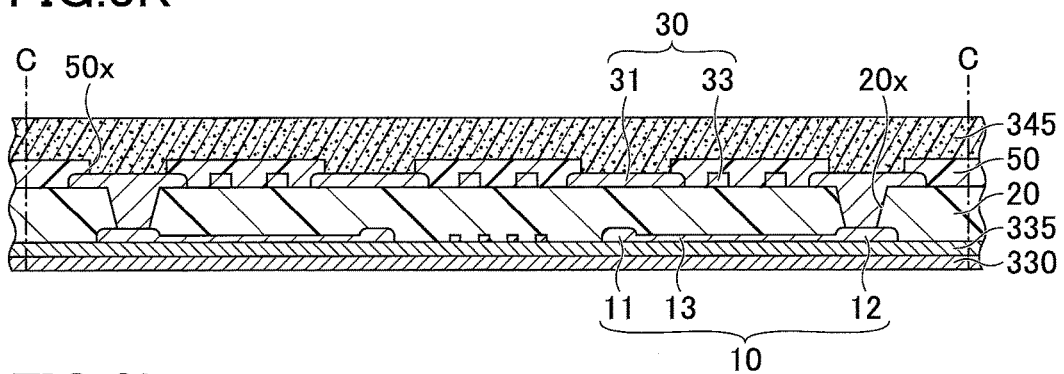

Next, in the process depicted in FIG. 3K, etching is performed to remove the thin foil 321 (see FIG. 3J) formed of copper. Wet etching may be performed, using, for example, an aqueous solution of hydrogen peroxide and sulfuric acid, an aqueous solution of sodium persulfate, or an aqueous solution of ammonium persulfate, to remove the thin foil 321 formed of copper. When the barrier layer 330 is formed of nickel, the barrier layer 330 is not etched with the above-described etchant for copper to serve as an etch stop layer to prevent the protection layer 335 from being etched.

Figure 3L:
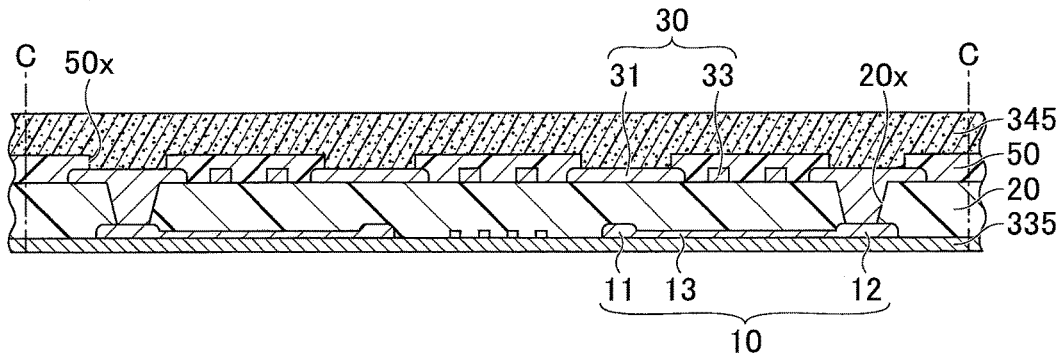

Next, in the process depicted in FIG. 3L, the barrier layer 330 (see FIG. 3K) is removed. When the barrier layer 330 is formed of nickel, an etchant that does not remove copper but removes nickel may be selected to etch the barrier layer 330 alone without etching the protection layer 335. For example, a liquid mixture of sulfuric acid and a hydrogen peroxide solution or a liquid mixture of nitric acid and a hydrogen peroxide solution may be used as an etchant that does not remove copper but removes nickel.

Figure 3M:
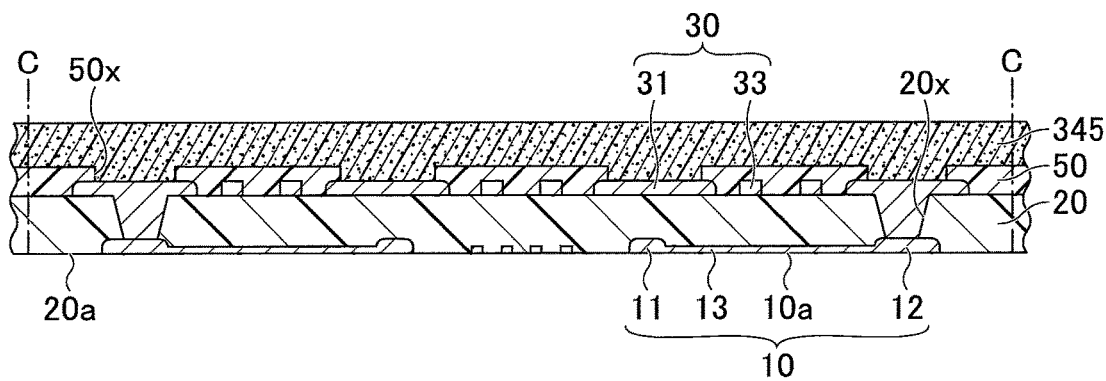

Next, in the process depicted in FIG. 3M, the protection layer 335 (see FIG. 3L) is removed. When the protection layer 335 is formed of copper, wet etching may be performed using the same etchant as in the process depicted in FIG. 3K to remove the protection layer 335. Because the protection layer 335 is substantially, uniform in film thickness, the thickness of the protection layer 335 is uniformly reduced for the entire etched surface. Therefore, by stopping etching when the protection layer 335 is removed to expose the first surface 20a of the insulating layer 20, it is possible to substantially eliminate a difference in level between the first surface 20a of the insulating layer 20 and the first surface 10a of the wiring layer 10 (that is, the first surface 20a of the insulating layer 20 can be substantially flush with the first surface 10a of the wiring layer 10).

As described above, the surface of the protection layer 335 contacting the first surface 20a of the insulating layer 20 is roughened. Therefore, the irregularities of the roughened surface of the protection layer 335 are transferred to the first surface 20a of the insulating layer 20. The roughness Ra of the first surface 20a of the insulating layer 20 is, for example, approximately 50 nm to approximately 500 nm. The roughened first surface 20a of the insulating layer 20 makes it possible to increase adhesion between the solder resist layer 40 formed in the process depicted in FIG. 3O and the insulating layer 20.

Figure 3N:
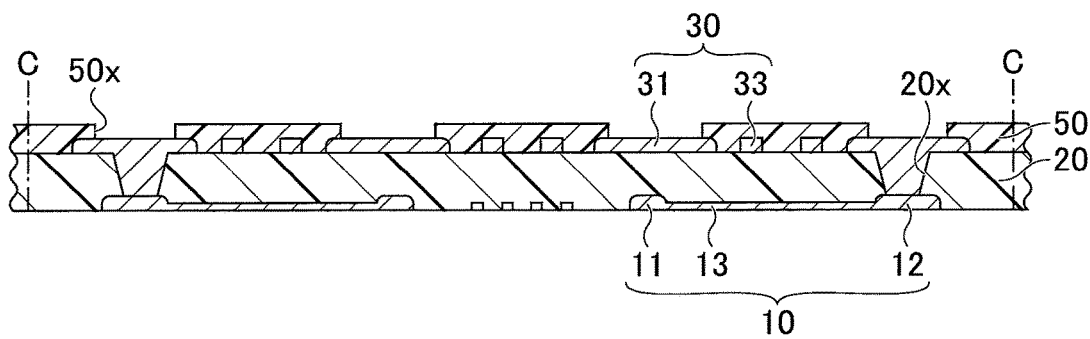
Figure 3O:
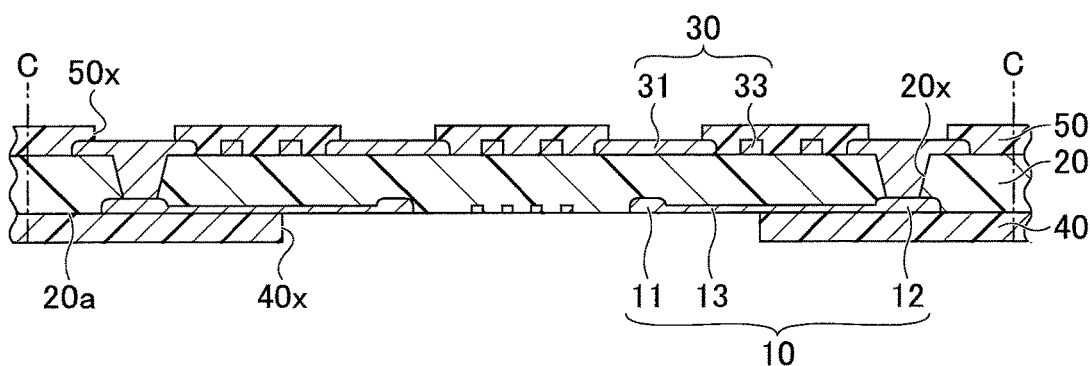

Next, in the process depicted in FIG. 3N, the mask 345 depicted in FIG. 3M is removed. Then, in the process depicted in FIG. 3O, the solder resist layer 40 is formed on the first surface 20a of the insulating layer 20 to cover the wiring layer 10. Furthermore, the opening 40x is formed in the solder resist layer 40 to expose the pads 11 and part of the wiring patterns 13. For example, the solder resist layer 40 and the opening 40x may be formed in the same manner as the solder resist layer 50 and the opening 50x in the process depicted in FIG. 3I. A metal layer may be formed on the first surfaces of the pads 11 and the first surfaces of the wiring patterns 13 exposed at the bottom of the opening 40x by, for example, electroless plating, as desired. Suitable examples of metal layers are as described above. Furthermore, an anti-oxidation treatment such as an OSP process may be performed on the first surfaces of the pads 11 and the first surfaces of the wiring patterns 13 exposed at the bottom of the opening 40x.

After the process depicted in FIG. 3O, the structure depicted in FIG. 3O is cut at cutting positions C into individual pieces with a slicer or the like to complete multiple wiring boards 1 (see FIGS. 1A and 1B). External connection terminals such as solder balls may be provided on the pads 11 exposed in the opening 40x of the solder resist layer 40 and the pads 31 exposed in the openings 50x of the solder resist layer 50, as desired.

Thus, according to the wiring board 1, the protection layer 335 is formed to prevent the upper surface (first surface) 10a of the wiring layer 10 from being unnecessarily etched. Therefore, it is possible to prevent reduction in the thickness of the wiring layer 10 to make the upper surface 20a of the insulating layer 20 and the upper surface 10a of the wiring layer 10 substantially flush with each other with substantially no steps between the upper surface 20a of the insulating layer 20 and the upper surface 10a of the wiring layer 10. Therefore, it is possible to provide the wiring layer 10 buried in the insulating layer 20 with a desired thickness, and accordingly, to avoid breakage of the wiring patterns 13 of the wiring layer 10 even when the wiring patterns 13 are formed to be thin for miniaturization and a higher density of the wiring patterns 13.

First Variation of First Embodiment

A first variation of the first embodiment is directed to another manufacturing method of the wiring board 1. In the following description of the first variation, a description of the same elements or configurations as those described above may be omitted.

FIGS. 4A through 4G are diagrams depicting a process of manufacturing a wiring board according to the first variation. First, the same processes as those of FIGS. 3A through 3H of the first embodiment are carried out. The roughening of the wiring layer 30 in the process of FIG. 3H, however, is not performed. Thereafter, in the process depicted in FIG. 4A, the mask 345 (such as a resin film) is formed on the insulating layer 20 to cover the wiring layer 30. For example, a polyethylene terephthalate film may be used as a resin film. The mask 345 is formed to protect the wiring layer 30 at the time of etching, for example, the thin foil 321.

Figure 4A:
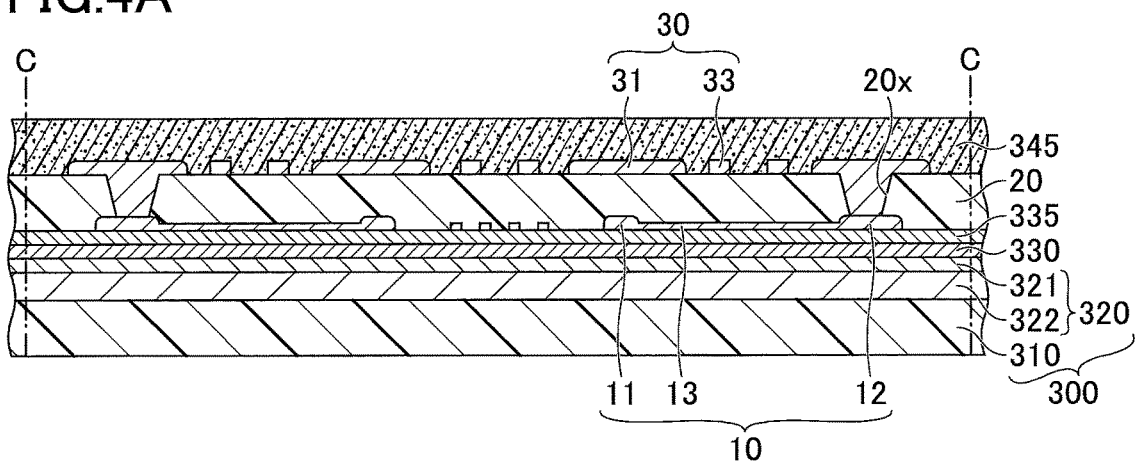
FIGS. 4A through 4G are diagrams depicting a process of manufacturing a wiring board according to a first variation of the first embodiment.
Figure 4B:
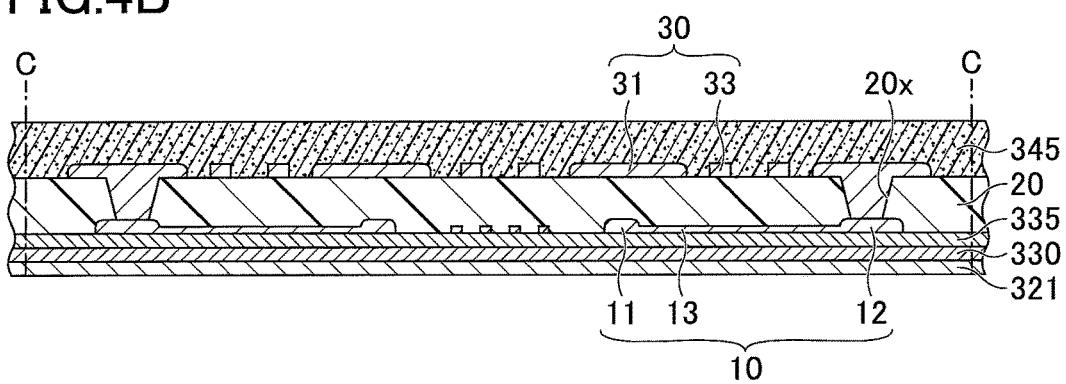
Figure 4C:
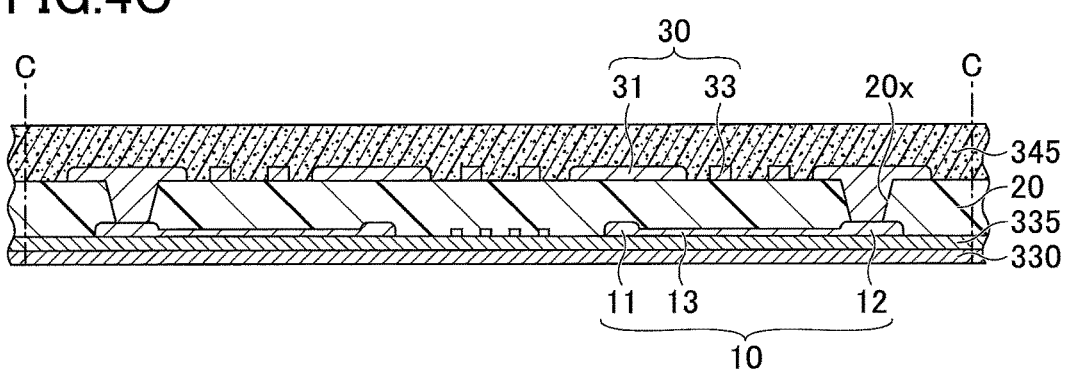
Figure 4D:
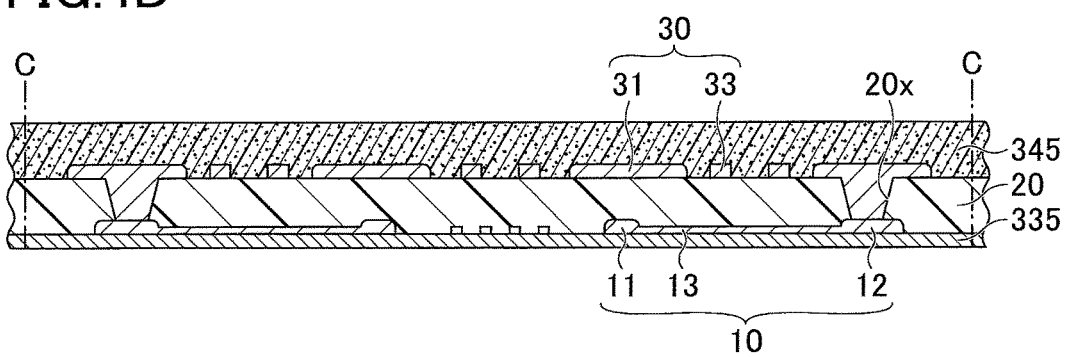

Next, in the processes depicted in FIGS. 4B through 4D, the prepreg 310 and the thick foil 322, the thin foil 321, and the barrier layer 330 are sequentially removed from the structure depicted in FIG. 4A in the same manner as in the processes of FIGS. 3J through 3L.

Figure 4E:
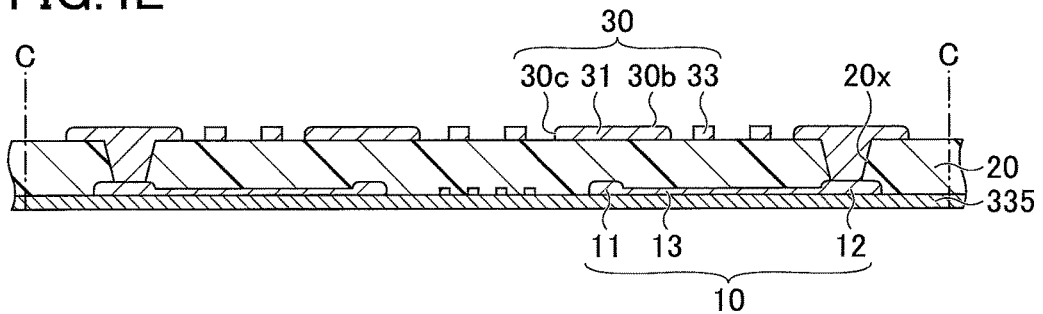
Figure 4F:
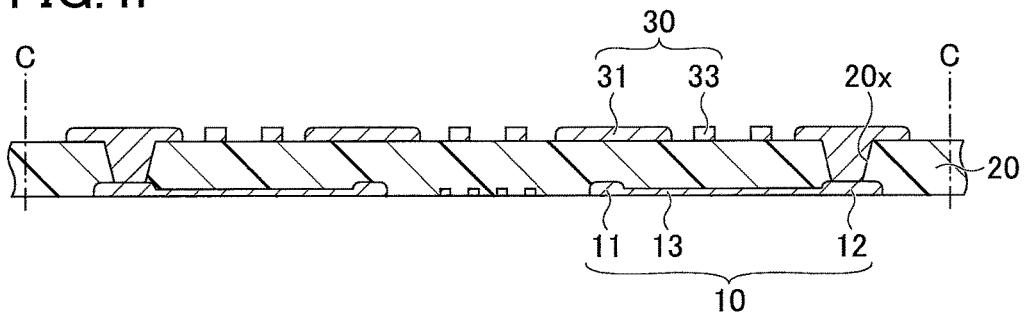

Next, in the process depicted in FIG. 4E, the mask 345 depicted in FIG. 4D is removed. Then, in the process depicted in FIG. 4F, simultaneously with removal of the protection layer 335 depicted in FIG. 4E, the second surface 30b and the side surface 30c of the wiring layer 30 are roughened. When the protection layer 335 and the wiring layer 30 are formed of copper, for example, an aqueous solution of hydrogen peroxide and sulfuric acid, an aqueous solution of sodium persulfate, or an aqueous solution of ammonium persulfate may be used to remove the protection layer 335 and roughen the wiring layer 30. As described above, the protection layer 335 has a uniform film thickness. Therefore, the thickness of the protection layer 335 is uniformly reduced for the entire etched surface. Accordingly, by stopping etching when the protection layer 335 is removed to expose the first surface 20a of the insulating layer 20, it is possible to substantially eliminate a difference in level between the first surface 20a of the insulating layer 20 and the first surface 10a of the wiring layer 10 (that is, the first surface 20a of the insulating layer 20 can be substantially flush with the first surface 10a of the wiring layer 10).

The roughness Ra of the second surfaces and side surfaces of the pads 31 and the wiring patterns 33 after roughening may be controlled by the thickness of the protection layer 335. For example, the thickness of the protection layer 335 may be increased to increase the roughness Ra of the second surfaces and side surfaces of the pads 31 and the wiring patterns 33 after roughening. The roughness Ra of the second surfaces and side surfaces of the pads 31 and the wiring patterns 33 after roughening may be, for example, approximately 50 nm to approximately 500 nm. In contrast, the roughness Ra of the first surfaces of the pads 11, the pads 12, and the wiring patterns 13 is approximately 30 nm to approximately 300 nm.

Figure 4G:
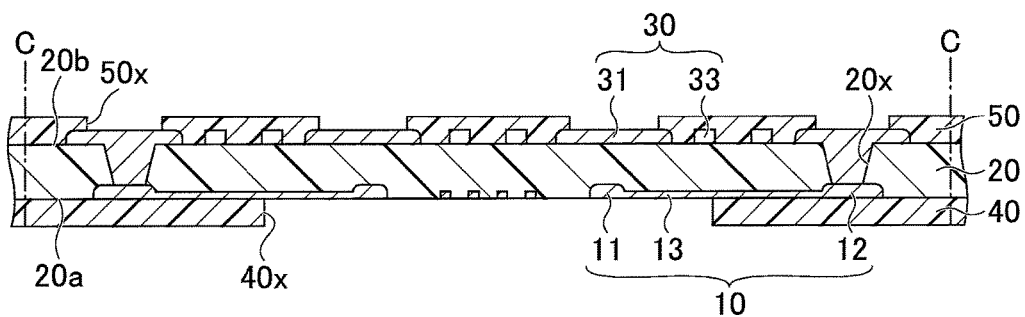

Next, in the process depicted in FIG. 4G, the solder resist layer 40 is formed on the first surface 20a of the insulating layer 20 to cover the wiring layer 10, and the solder resist layer 50 is formed on the second surface 20b of the insulating layer 20 to cover the wiring layer 30. Then, the opening 40x is formed in the solder resist layer 40, and the openings 50x are formed in the solder resist layer 50. For example, the solder resist layers 40 and 50 and the openings 40x and 50x may be formed in the same manner as the solder resist layer 50 and the opening 50x in the process depicted in FIG. 3I.

A metal layer may be formed on the first surfaces of the pads 11 and the wiring patterns 13 exposed at the bottom of the opening 40x and on the second surfaces of the pads 31 exposed at the bottom of the openings 50x by, for example, electroless plating, as desired. Suitable examples of metal layers are as described above. Furthermore, an anti-oxidation treatment such as an OSP process may be performed on the first surfaces of the pads 11 and the wiring patterns 13 exposed at the bottom of the opening 40x and on the second surfaces of the pads 31 exposed at the bottom of the openings 50x. The subsequent processes are the same as in the first embodiment.

According to the first variation, in addition to the effects according to the first embodiment, the following effect is produced. That is, because the protection layer 335 is removed and the wiring layer 30 is roughened in the same process, and the solder resist layers 40 and 50 are formed in the same process, it is possible to simplify a manufacturing process.

Second Variation of Second Embodiment

A second variation of the first embodiment is directed to yet another manufacturing process of the wiring board 1. In the following description of the second variation, a description of the same elements or configurations as those described above may be omitted.

Figure 5A:
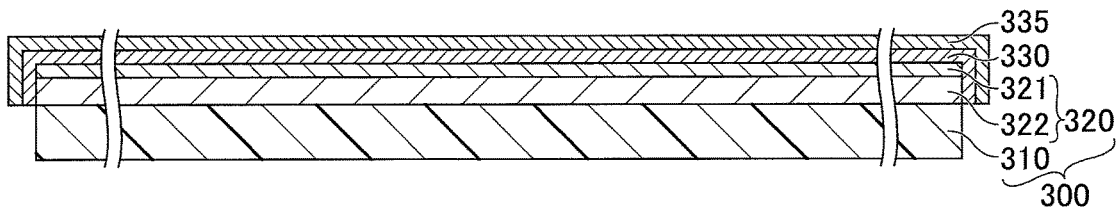
FIGS. 5A and 5B are diagrams depicting processes of manufacturing a wiring board according to a second variation of the first embodiment.
Figure 5B:
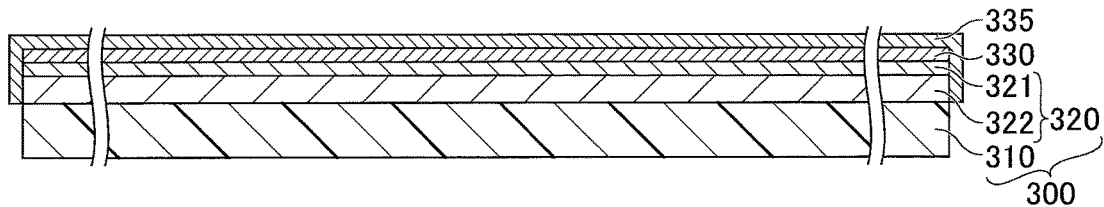

FIGS. 5A and 5B are diagrams depicting processes of manufacturing a wiring board according to the second variation. In the processes depicted in FIGS. 3B and 3C of the first embodiment, the barrier layer 330 and the protection layer 335 may be formed to continuously cover the top surface of the thin foil 321 of the support 300 and the side surface of the carrier-supported metal foil 320 (the side surface of the thin foil 321 and the side surface of the thick foil 322) as depicted in FIG. 5A. The processes subsequent to the process of FIG. 5A are the same as the processes subsequent to FIG. 3C of the first embodiment.

Alternatively, in the process depicted in FIG. 3C of the first embodiment, the protection layer 335 may be formed to continuously cover the top surface and side surface of the barrier layer 330 and the side surface of the carrier-supported metal foil 320 (the side surface of the thin foil 321 and the side surface of the thick foil 322) as depicted in FIG. 5B. The processes subsequent to the process of FIG. 5B are the same as the processes subsequent to FIG. 3C of the first embodiment.

According to the second variation, in addition to the effects according to the first embodiment, the following effect is produced. That is, by covering the side surface of the carrier-supported metal foil 320 with the barrier layer 330 and the protection layer 335 or with the protection layer 335, it is possible to prevent unexpected separation of the carrier-supported metal foil 320 (delamination of the thin foil 321 and the thick foil 322) during the manufacture of the wiring board 1.

Third Variation of First Embodiment

A third variation of the first embodiment is directed to still another manufacturing process of the wiring board 1. In the following description of the third variation, a description of the same elements or configurations as those described above may be omitted.

Figure 6A:
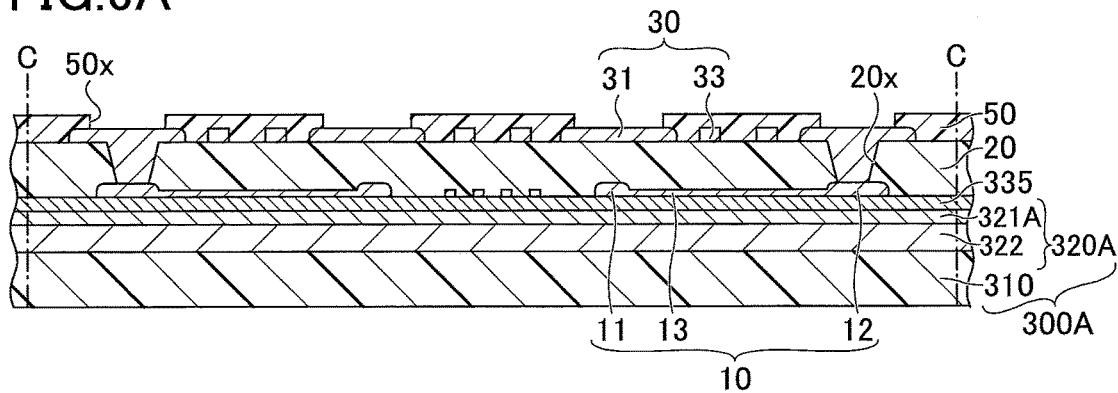
FIGS. 6A through 6C are diagrams depicting a process of manufacturing a wiring board according to a third variation of the first embodiment.
Figure 6B:
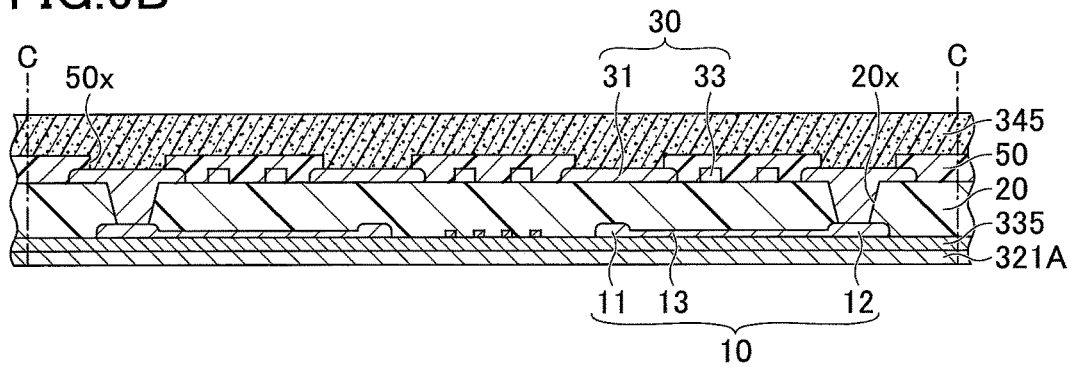
Figure 6C:
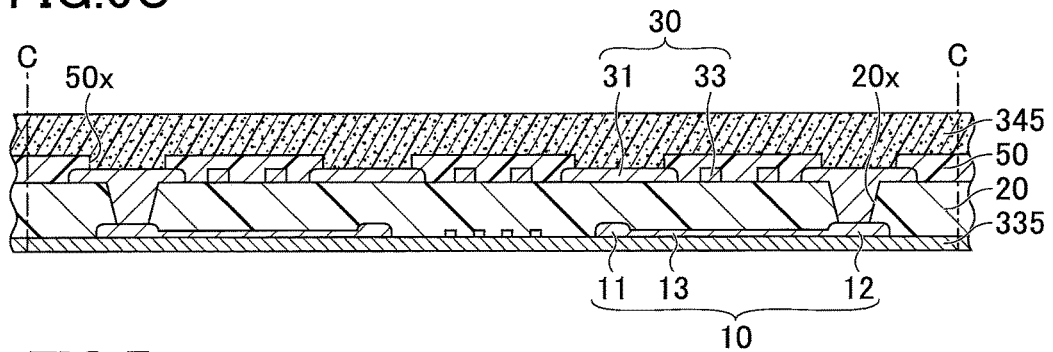

FIGS. 6A through 6C are diagrams depicting a process of manufacturing a wiring board according to the third variation. According to the third variation, a support 300A including the prepreg 310 and carrier-supported metal foil 320A stacked on the prepreg 310 is used. The carrier-supported metal foil 320A includes the thick foil (carrier foil) 322 formed of copper and having a thickness of approximately 10 μm to approximately 50 μm, and thin foil 321A formed of nickel and having a thickness of approximately 1.5 μm to approximately 5 μm. The thin foil 321A separably adheres to the thick foil 322 through a delamination layer (not depicted).

First, in the process depicted in FIG. 6A, after preparing the support 300A in the same manner as in the process depicted in FIG. 3A, the same processes as those depicted in FIGS. 3C through 3I are performed to stack the protection layer 335, the wiring layer 10, the insulating layer 20, the wiring layer 30, and the solder resist layer 50 on the support 300A.

Next, in the process depicted in FIG. 6B, the mask 345 is formed on the solder resist layer 50, using a resin film or the like, in the same manner as in the process depicted in FIG. 3J. The mask 345 fills in the openings 50x. Thereafter, the prepreg 310 and the thick foil 322 of the support 300A are separated from the structure depicted in FIG. 6A. As a result, the thin foil 321A alone remains on the protection layer 335, and the other members of the support 300A (the prepreg 310 and the thick foil 322) are removed.

Next, in the process depicted in FIG. 6C, etching is performed to remove the thin foil 321A formed of nickel (see FIG. 6B). An etchant that does not remove copper but removes nickel may be selected to etch the thin foil 321A alone without etching the protection layer 335. The processes subsequent to FIG. 6C are the same as the processes subsequent to the process of FIG. 3L of the first embodiment.

According to the third variation, in addition to the effects according to the first embodiment, the following effect is produced. That is, the support 300A including the thin foil 321A formed of nickel is used, so that the thin foil 321A serves as an etch stop layer. Therefore, a process for forming the barrier layer 330 on the support 300A is unnecessary. Accordingly, it is possible to simply a manufacturing process.

Second Embodiment

A second embodiment is directed to a wiring board having a three-layer structure. In the following description of the second embodiment, a description of the same elements or configurations as those described above may be omitted.

Figure 7:
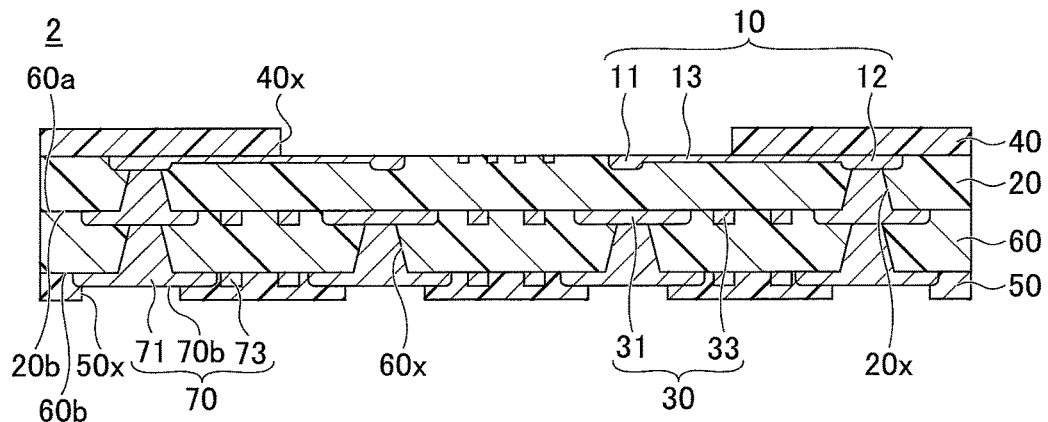
FIG. 7 is a cross-sectional view of a wiring board according to a second embodiment.

FIG. 7 is a cross-sectional view of a wiring board according to the second embodiment. Referring to FIG. 7, a wiring board 2 according to the second embodiment is different from the wiring board 1 according to the first embodiment (see FIGS. 1A and 1B) in further including an insulating layer 60 and a wiring layer 70 interposed between the wiring layer 30 and the solder resist layer 50.

The insulating layer 60 is formed on the lower surface 20b of the insulating layer 20 to cover the wiring layer 30. The material, thickness, and formation method of the insulating layer 60 may be the same as those of the insulating layer 20, for example.

The wiring layer 70 is formed on a lower surface 60b of the insulating layer 60. The material and formation method of the wiring layer 70 may be the same as those of the wiring layer 30, for example. The wiring layer 70 includes external connection pads 71 ("pads 71") to be connected to another wiring board or the like, and wiring patterns 73. The pads 71 may be connected to the wiring patterns 73. The pads 71 are connected to the pads 31 through vias filling in via holes 60x piercing through the insulating layer 60 to expose the lower surfaces of the pads 31. Each via hole 60x has the shape of a truncated cone, and has an upper-side opening and a lower-side opening that are open at an upper surface 60a and the lower surface 60b, respectively, of the insulating layer 60. The lower-side opening is greater in diameter than the upper-side opening. Each pad 71 is monolithically formed with one of the vias in the via holes 60x.

The solder resist layer 50 includes the openings 50x, and the lower surfaces of the pads 71 of the wiring layer 70 are exposed at the bottom of the openings 50x. As described above with respect to, for example, the wiring layer 30, a metal layer may be formed on a lower surface 70b of the wiring layer 70 exposed in the openings 50x, as desired. Furthermore, instead of forming a metal layer, an anti-oxidation treatment such as an OSP process may be performed on the lower surface 70b of the wiring layer 70 exposed in the openings 50x.

Thus, the insulating layer 60 and the wiring layer 70 may be formed between the wiring layer 30 and the solder resist layer 50 to form the wiring board 2 having a three-layer structure. For example, the insulating layer 60 and the wiring layer 70 may be foisted in the same manner as the insulating layer 20 and the wiring layer 30, respectively. A desired number of insulating layers and a desired number of wiring layers may be further formed alternately with each other between the wiring layer 30 and the solder resist layer 50 to form a wiring board having a structure of four or more layers.

[First Application of Wiring Board]

According to a first application of a wiring board, a semiconductor chip is mounted on a wiring board according to the first or second embodiment (by flip chip bonding) to form a semiconductor package. In the following description of the first application, a description of the same elements or configurations as those described above may be omitted.

Figure 8A:
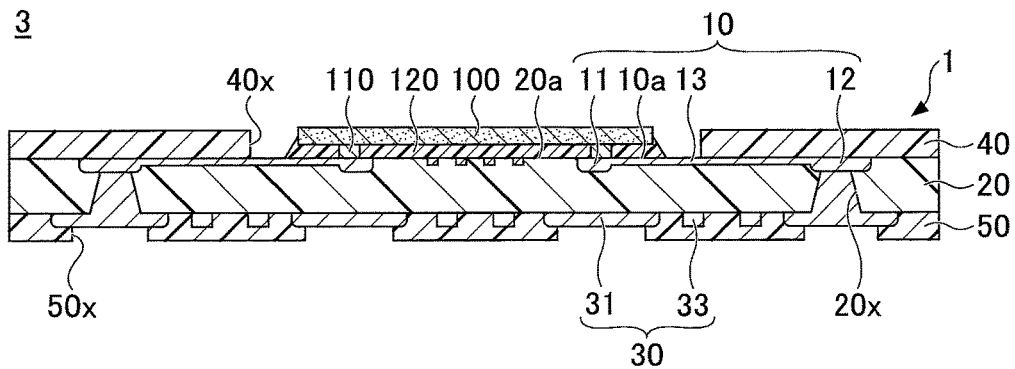
FIGS. 8A and 8B are cross-sectional views of semiconductor packages according to a first application.
Figure 8B:
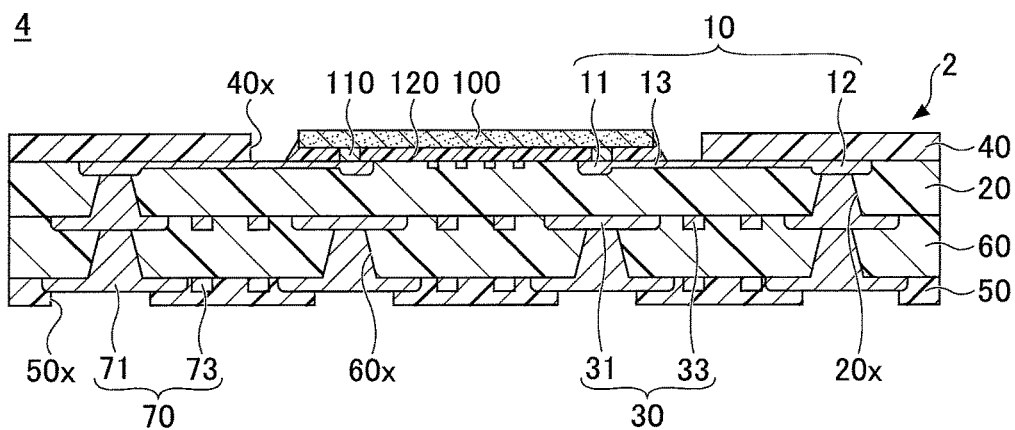

FIGS. 8A and 8B are cross-sectional views of semiconductor packages according to the first application. Referring to FIG. 8A, a semiconductor package 3 includes the wiring board 1 depicted in FIGS. 1A and 1B, a semiconductor chip 100, bumps 110, and an underfill resin 120. According to the semiconductor package 3, a surface of the wiring board 1 on the solder resist layer 40 side serves as a semiconductor chip mounting surface on which the semiconductor chip 100 is mounted, and a surface of the wiring board 1 on the solder resist layer 50 side serves as an external connection surface on which external connection terminals are to be formed.

The semiconductor chip 100 includes, for example, a thinned semiconductor substrate formed of silicon (not depicted) and a semiconductor integrated circuit (not depicted) formed on the semiconductor substrate. Electrode pads (not depicted) are formed on the semiconductor substrate to be electrically connected to the semiconductor integrated circuit.

The bumps 110 electrically connect the electrode pads of the semiconductor chip 100 and the pads 11 of the wiring layer 10 exposed in the opening 40x of the solder resist layer 40 of the wiring board 1. The bumps 110 are, for example, solder bumps. Suitable materials for solder bumps include, for example, alloys containing lead (Pb), tin-copper (Sn—Cu) alloys, tin-silver (Sn—Ag) alloys, and tin-silver-copper (Sn—Ag—Cu) alloys. The underfill resin 120 fills in the space between the semiconductor chip 100 and the wiring board 1 (the insulating layer 20).

Thus, the semiconductor chip 100 may be mounted on the wiring board 1 according to the first embodiment to form the semiconductor package 3. Furthermore, the semiconductor chip 100 may be mounted on the wiring board 2 according to the second embodiment to form a semiconductor package 4 as depicted in FIG. 8B.

The pads 11 may include multiple types of pads having different widths. In this case, pads that differ in width also differ in thickness (wider pads are thicker). The surfaces of the pads 11 on which the semiconductor chip 100 is mounted, however, are in the same plane. Accordingly, even when the pads 11 differ in width, the gap between the pads 11 and the electrode pads of the semiconductor chip 100 is constant, thus making it easy to connect the pads 11 and the electrode pads of the semiconductor chip 100.

Furthermore, the upper surface 10a of the wiring layer 10 and the upper surface 20a of the insulating layer 20 are substantially flush with each other to form a substantially even surface. Therefore, when the underfill resin 120 is formed, a flow of the underfill resin 120 is not hindered. Furthermore, when the underfill resin 120 includes a filler, a filler is prevented from being trapped on, for example, the upper surface 10a of the wiring layer 10. Accordingly, it is possible to improve the connection reliability of the wiring board 1 and the semiconductor chip 100.

[Second Application of Wiring Board]

According to a second application of a wiring board, a semiconductor package is mounted on another semiconductor package to form a semiconductor package having a so-called package-on-package (POP) structure. In the following description of the second application, a description of the same elements or configurations as those described above may be omitted.

Figure 9:
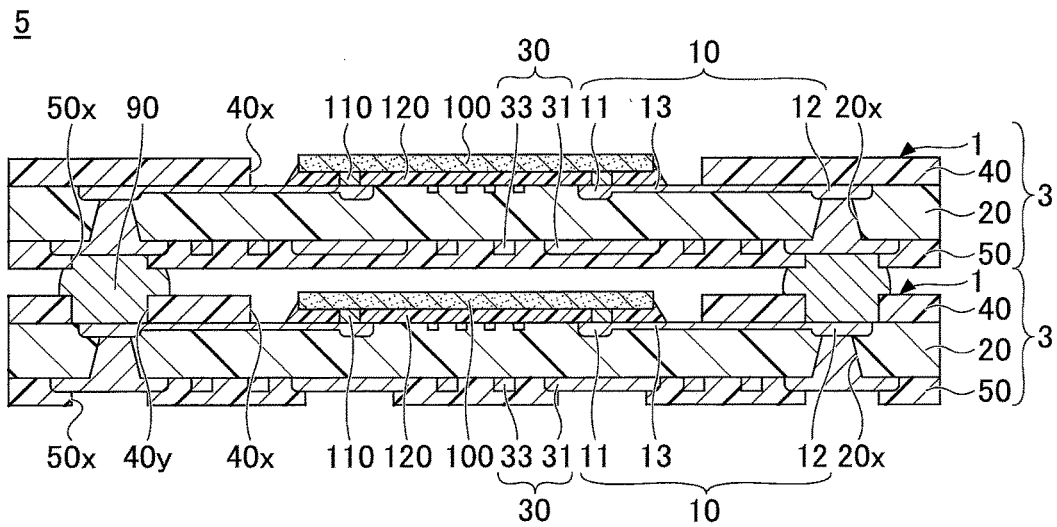
FIG. 9 is a cross-sectional view of a semiconductor package according to a second application.

FIG. 9 is a cross-sectional view of a semiconductor package according to the second application. Referring to FIG. 9, a semiconductor package 5 includes a first (lower) semiconductor package 3 and a second (upper) semiconductor package 3 mounted on the first semiconductor package 3.

In the lower semiconductor package 3, the solder resist layer 40 of the wiring board 1 further includes openings 40y that expose the upper surfaces of the pads 12. Furthermore, the pads 12 exposed in the openings 40y of the solder resist layer 40 of the lower semiconductor package 3 and the pads 31 exposed in the openings 50x of the solder resist layer 50 of the upper semiconductor package 3 are connected by bumps 90. For example, solder balls having a structure of a copper core ball enclosed by solder may be used as the bumps 90.

Thus, the wiring board 1 according to the first embodiment may be used to form the semiconductor package 5 having a POP structure. The wiring board 2 according to the second embodiment may alternatively be used instead of the wiring board 1.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, according to the above-described methods of manufacturing a wiring board, the carrier-supported metal foil 320 or 320A may be stacked on each of the top surface and the bottom surface of the prepreg 310 to form a support, and a wiring board may be formed on each of the top surface and the bottom surface of the support.

Furthermore, two or more of the above-described embodiments and variations may be suitably combined.

Various aspects of the subject-matter described herein may be set out non-exhaustively in the following numbered clauses:

1. A method of manufacturing a wiring board including a semiconductor chip mounting surface and an external connection surface on first and second opposite sides, respectively, of the wiring board, the method including:

forming a protection layer on a support;

forming a first wiring layer on the protection layer, the first wiring layer being an outermost wiring layer on the first side of the wiring board;

performing a first roughening process on a surface of the first wiring layer other than a surface of the first wiring layer contacting the protection layer;

forming at least one insulating layer on the protection layer so that the at least one insulating layer covers the first wiring layer;

forming a second wiring layer on the at least one insulating layer, the second wiring layer being an outermost wiring layer on the second side of the wiring board;

performing a second roughening process on a surface of the second wiring layer other than a surface of the second wiring layer contacting the at least one insulating layer; and removing the support, wherein the surface of the first wiring layer contacting the protection layer is a first exposed surface of the first wiring layer exposed at a first surface of the at least one insulating layer on the first side of the wiring board, wherein the surface of the second wiring layer other than the surface of the second wiring layer contacting the at least one insulating layer is a second exposed surface of the second wiring layer exposed on a second surface of the at least one insulating layer on the second side of the wiring board, and a roughness of the first exposed surface is smaller than a roughness of the second exposed surface.

2. The method of clause 1, further including:
removing the protection layer,
wherein the protection layer and the second wiring layer are formed of a same material, and
wherein, in said removing the protection layer, simultaneously with removing the protection layer by etching, the second roughening process is performed on the surface of the second wiring layer other than the surface of the second wiring layer contacting the at least one insulating layer.

3. The method of clause 2,
wherein, in said performing the first roughening process, simultaneously with roughening the surface of the first wiring layer other than the surface of the first wiring layer contacting the protection layer, a surface of the protection layer is roughened, and
wherein, in said removing the protection layer, irregularities of the roughened surface of the protection layer are transferred to a surface of the at least one insulating layer contacting the roughened surface of the protection layer.

What is claimed is:

1. A wiring board, comprising:
an insulating layer;
a first wiring layer formed in a first surface of the insulating layer, and including a pad on which a semiconductor chip is to be mounted and a wiring pattern, the first wiring layer being formed of a single metal layer, the first wiring layer being buried in the insulating layer, the first wiring layer including a first surface exposed at the first surface of the insulating layer, a second surface opposite to the first surface of the first wiring layer and covered with the insulating layer, and a side surface extending from the first surface of the first wiring layer to the second surface of the first wiring layer and covered with the insulating layer; and
a second wiring layer formed on a second surface of the insulating layer opposite to the first surface of the insulating layer,
wherein a roughness of the first surface of the first wiring layer is smaller than a roughness of a surface of the second wiring layer exposed on the second surface of the insulating layer,
wherein an entirety of the side surface of the first wiring layer is a roughened surface, and
wherein the roughness of the first surface of the first wiring layer is smaller than a roughness of the second surface of the first wiring layer and a roughness of the side surface of the first wiring layer.

2. The wiring board as claimed in claim 1, wherein the first surface of the first wiring layer is flush with the first surface of the insulating layer.

3. The wiring board as claimed in claim 1, wherein a line and a space of the wiring pattern of the first wiring layer is smaller than a line and a space of a wiring pattern of the second wiring layer.

4. The wiring board as claimed in claim 1, wherein the roughness of the first surface of the first wiring layer is smaller than a roughness of the first surface of the insulating layer.

5. The wiring board as claimed in claim 1, wherein the exposed surface of the second wiring layer includes a side surface of the second wiring layer and a surface of the second wiring layer facing away from the second surface of the insulating layer.

6. The wiring board as claimed in claim 1, wherein the first wiring layer includes a first part having a first width and a first thickness, and a second part having a second width greater than the first width and having a second thickness greater than the first thickness.

7. The wiring board as claimed in claim 6, wherein
the wiring pattern extends from the pad in a first direction, and
the first width and the second width are dimensions in a second direction perpendicular to the first direction.

8. The wiring board as claimed in claim 6, wherein
the first part is the wiring pattern, and
the second part is the pad.

9. The wiring board as claimed in claim 1, further comprising:
a via provided in the insulating layer to electrically connect the first wiring layer and the second wiring layer,
wherein the first wiring layer further includes an additional pad, and
wherein the via has an end connected to a surface of the additional pad included in the second surface of the first wiring layer.

10. A wiring board including a first board surface and a second board surface on opposite sides of the wiring board, the wiring board comprising:
a plurality of insulating layers including a first insulating layer and a second insulating layer, the first insulating layer having a first surface in the first board surface, the second insulating layer having a second surface in the second board surface;
a first wiring layer formed in the first surface of the first insulating layer, and including a pad on which a semiconductor chip is to be mounted and a wiring pattern, the first wiring layer being formed of a single metal layer, the first wiring layer being buried in the first insulating layer, the first wiring layer including a first surface exposed at the first surface of the first insulating layer, a second surface opposite to the first surface of the first wiring layer and covered with the first insulating layer, and a side surface extending from the first surface of the first wiring layer to the second surface of the first wiring layer and covered with the first insulating layer; and
a second wiring layer formed on the second surface of the second insulating layer,
wherein a roughness of the first surface of the first wiring layer is smaller than a roughness of a surface of the second wiring layer exposed on the second surface of the second insulating layer,
wherein an entirety of the side surface of the first wiring layer is a roughened surface, and
wherein the roughness of the first surface of the first wiring layer is smaller than a roughness of the second surface of the first wiring layer and a roughness of the side surface of the first wiring layer.

11. The wiring board as claimed in claim 10, wherein the first surface of the first wiring layer is flush with the first surface of the first insulating layer.

12. The wiring board as claimed in claim 10, wherein a line and a space of the wiring pattern of the first wiring layer is smaller than a line and a space of a wiring pattern of the second wiring layer.

13. The wiring board as claimed in claim 10, wherein the roughness of the first surface of the first wiring layer is smaller than a roughness of the first surface of the first insulating layer.

14. The wiring board as claimed in claim 10, wherein the exposed surface of the second wiring layer includes a side surface of the second wiring layer and a surface of the second wiring layer facing away from the second surface of the second insulating layer.

15. The wiring board as claimed in claim 10, wherein the first wiring layer includes a first part having a first width and a first thickness, and a second part having a second width greater than the first width and having a second thickness greater than the first thickness.

16. The wiring board as claimed in claim 15, wherein
the wiring pattern extends from the pad in a first direction, and
the first width and the second width are dimensions in a second direction perpendicular to the first direction.

17. The wiring board as claimed in claim 15, wherein
the first part is the wiring pattern, and
the second part is the pad.

18. The wiring board as claimed in claim 10, further comprising:
a first via provided in the first insulating layer; and
a second via provided in the second insulating layer and electrically connected to the first via,
wherein the first via and the second via electrically connect the first wiring layer and the second wiring layer,
wherein the first wiring layer further includes an additional pad, and
wherein the first via has an end connected to a surface of the additional pad included in the second surface of the first wiring layer.

* * * * *